(12) United States Patent
Kikuchi

(10) Patent No.: US 6,510,168 B1
(45) Date of Patent: Jan. 21, 2003

(54) LASER DIODE DRIVE CIRCUIT

(75) Inventor: Osamu Kikuchi, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 112 days.

(21) Appl. No.: 09/669,878

(22) Filed: Sep. 27, 2000

(30) Foreign Application Priority Data

Mar. 6, 2000 (JP) .......................... 2000-065719

(51) Int. Cl.[7] .................................. H01S 3/00

(52) U.S. Cl. ................ 372/38.02; 372/31; 315/149; 315/151

(58) Field of Search ................ 372/38.02, 31

(56) References Cited

U.S. PATENT DOCUMENTS

| | | | | |
|---|---|---|---|---|
| 5,349,595 A | * | 9/1994 | Ogawa et al. | 372/38 |
| 5,883,910 A | * | 3/1999 | Link | 372/38 |
| 5,991,320 A | * | 11/1999 | Nakayama | 372/38 |
| 6,097,159 A | * | 8/2000 | Mogi et al. | 315/151 |
| 6,249,178 B1 | * | 6/2001 | Umeda | 327/563 |

* cited by examiner

*Primary Examiner*—Paul Ip
*Assistant Examiner*—Leith Al-Nazer
(74) *Attorney, Agent, or Firm*—Rabin & Berdo, P.C.

(57) ABSTRACT

A drive current Ip used to control the light output from a laser diode LD is controlled by using an output Vsft from a level shift circuit 3. By inserting the level shift circuit 3 between a drive source (V+) and a switch buffer 5, the lower limit (V+)−(V−) of the drive voltage in the circuit is lowered to enable the laser diode drive circuit to be driven at a lower voltage and to achieve a reduction in power consumption.

2 Claims, 5 Drawing Sheets

( PRIOR ART )

LASER DIODE DRIVE CIRCUIT

BACKGROUND OF THE INVENTION

1. Field of the Invention

The present invention relates to a laser diode drive circuit utilized in an optical communication system, and more specifically, a laser diode drive circuit utilized in an optical transmission system that converts an electrical signal to an optical signal by using a laser diode.

2. Description of the Related Art

FIG. 5 shows a laser diode drive circuit 501 in the related art. The laser diode drive circuit 501 comprises drive sources (V+) and (V−), a switch buffer 503, a switch circuit 507, a laser diode LD, resistors R5 and R505 and the like. The continuity of transistors Q5 and Q6 at the switch circuit 507 is switched by switch control input signals Vin1 (positive phase) and Vin2 (negative phase) to achieve electrical continuity for a drive current IP either with the laser diode LD-side or with the resistor R5-side. The laser diode LD generates an optical signal corresponding to an input signal by emitting/not emitting light. In addition, the level of the drive current Ip which determines the light output power of the laser diode LD is controlled by a base potential Vb of a transistor Q503 which is connected in cascade to the switch circuit 507.

The lower limit of source voltage (V+)−(V−) at this laser diode drive circuit 501 is expressed as follows:

$$(V+)-(V-) \geq i \; Vf + Vsw/2 + Vce5 + Vce503 + Ip \cdot R505 \quad \text{(expression 1)}$$

with Vf representing the forward voltage of the laser diode LD, Vsw representing the output amplitude of the switch buffer 503 and Vce5 and Vce503 respectively representing minimum values of the collector-emitter voltages at the transistors Q5 and Q503. More specifically, Vf is approximately 1.5V, Vsw is approximately 0.3V, Vce5 and Vce 503 are both approximately 0.45V, and Ip·R505 is approximately 0.35V. Thus, the lower limit of the source voltage in the circuit in the related art is calculated by using (expression 1) as; $(V+)-(V-) \geq 2.9V$, and a 3.3V single source which is normally used in communication systems at present is utilized for the source voltage.

However, in the circuit structure in the related art achieved by connecting in cascade the current control transistor Q503 to the switch circuit 507, the source voltage lower limit cannot be reduced, and therefore, it cannot support the 2.5V single source expected to become the mainstream source in the future.

SUMMARY OF THE INVENTION

An object of the present invention, which has been completed by addressing the problem discussed above, is to achieve low voltage drive and low power consumption in a laser diode drive circuit.

In order to achieve the object described above, the present invention provides a laser diode drive circuit comprising a level shift circuit connected to a drive source, which reduces the drive source voltage by a specific degree, a current switch that turns on/off a laser diode connected to the drive source and a switch buffer connected to the level shift circuit, which implements control on the current switch.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
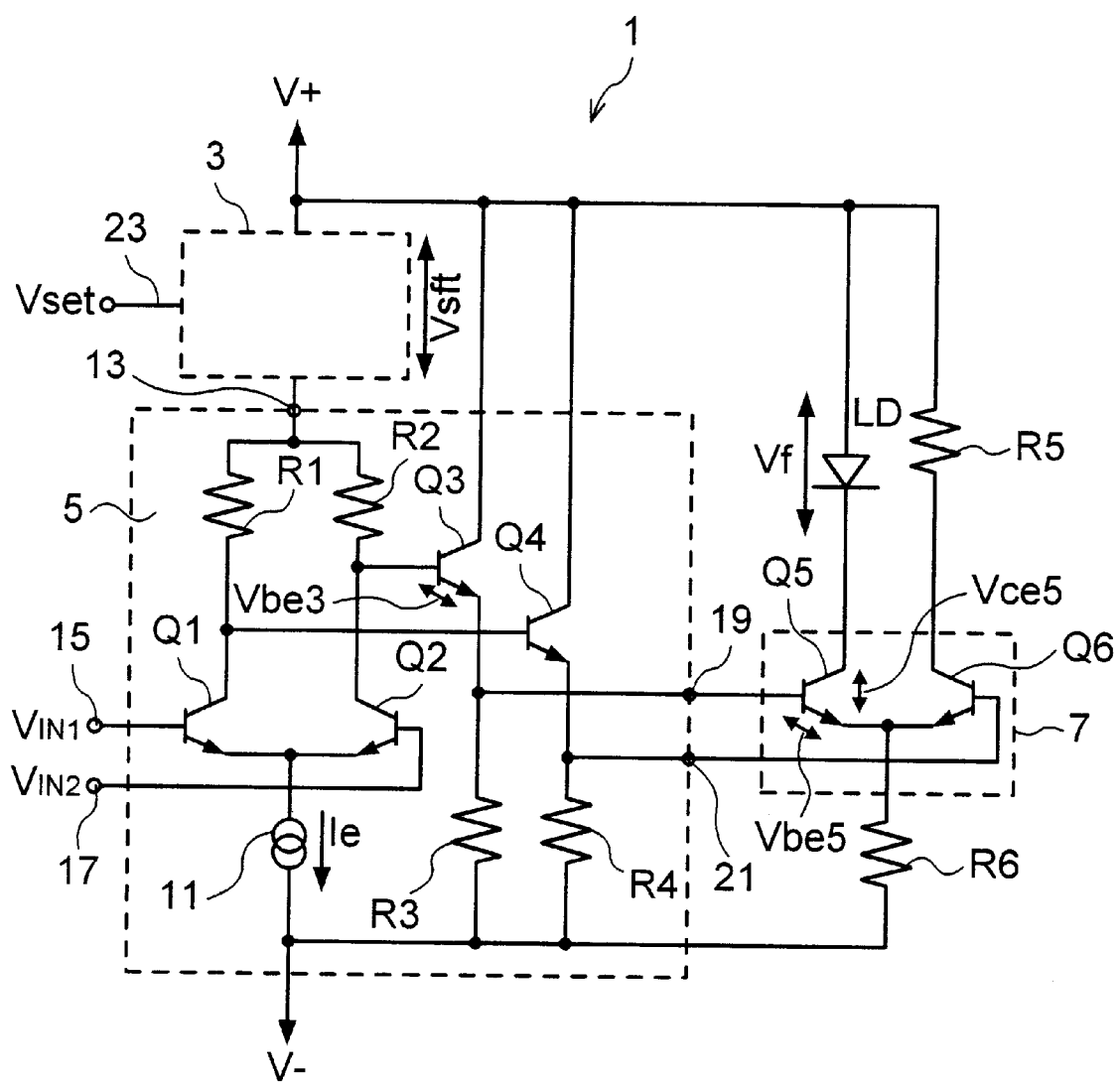
FIG. 1 is a circuit diagram of the laser diode drive circuit in a first embodiment of the present invention.

The following is a detailed explanation of the first embodiment of the present invention, given in reference to a drawing. FIG. 1 illustrates a laser diode drive circuit 1 in the first embodiment of the present invention. First, the structure of the laser diode drive circuit 1 is explained. The laser diode drive circuit 1 comprises drive sources (V+) and (V−), a level shift circuit 3 that is inserted in series to the drive source (V+) and a switch buffer 5 that is connected in series to the level shift circuit 3.

The laser diode drive circuit 1 further comprises a current switch 7 that is controlled by the output from the switch buffer 5 and a laser diode LD and a resistor R5 that are switched by the current switch 7.

The level shift circuit 3 varies the output Vsft of the level shift circuit 3 by controlling a Vset input to an input terminal 23, to adjust a current Ip for driving the laser diode LD which is to be detailed later.

Next, the structure of the switch buffer 5 is explained. A voltage (V+)−Vsft achieved by reducing the voltage of the drive source (V+) by the output voltage Vsft from the level shift circuit 3 is supplied to a terminal 13, resistors R1 and R2 are connected in parallel to one end of the terminal 13 and the collectors of transistors Q1 and Q2 are respectively connected to the other ends of the resistors R1 and R2. The emitters of the transistors Q1 and Q2 are commonly connected and are also connected to the drive source (V−) through a constant current source 11.

Vin1 (positive phase) is input through a switch control input terminal 15 to the base of the transistor Q1, and the collector of the transistor Q1 is connected to the base of a transistor Q4. In addition, Vin2 (negative phase) is input through a switch control input terminal 17 to the base of the transistor Q2, and the collector of the transistor Q2 is connected to the base of a transistor Q3.

The collectors of the transistors Q3 and Q4 are connected to the drive source (V+) and their emitters are connected to the drive source (V−) via resistors R3 and R4 respectively to constitute an emitter follower. In addition, the emitters of the transistors Q3 and Q4 are respectively connected to output terminals 19 and 21 so that their outputs are supplied to the current switch 7 provided at a rear stage.

The current switch 7 is constituted of transistors Q5 and Q6 The collector of the transistor Q5 is connected to the cathode of the laser diode LD, with the anode of the laser diode LD connected to the drive source (V+). The collector of the transistor Q6 is connected to the drive source (V+) via a resistor R5. The emitters of the transistors Q5 and Q6 are commonly connected and are connected to the drive source (V−) via a resistor R6. The output terminals 19 and 21 of the switch buffer circuit 5 are respectively connected to the bases of the transistors Q5 and Q6.

Next, the operation achieved in the laser diode drive circuit 1 is explained. The input voltage Vset for controlling the drive current Ip for the laser diode LD is applied to the input terminal 23 of the level shift circuit 3, and an output voltage Vsft is obtained. Thus, the voltage (V+)−Vsft is applied to a source terminal 13 of the switch buffer 5.

When a high level is applied as the input Vin1 (positive phase) at a switch control input terminal 15 and a low level is applied as the input Vin2 (negative phase) at a switch control input terminal 17 in the switch buffer 5, the transistor Q1 is turned ON and the transistor Q2 is turned OFF. Since Ie flows to the transistor Q1, a voltage reduction occurs at the resistor R1, resulting in the base potential at the transistor Q3 becoming higher than the base potential at the transistor Q4.

Since the transistors Q3 and Q4 are utilized as an emitter follower, both of them remain ON at all times, and their emitter-base voltages are roughly equal to each other. As a result, the emitter potential at the transistor Q3 becomes higher than the emitter potential at the transistor Q4. Thus, the transistor Q5 having the emitter output from the transistor Q3 input to the base thereof is turned ON, and the laser diode LD achieves electrical continuity and emits light. At this time, the transistor Q6 is in an OFF state.

If, on the other hand, a low level is applied as the input Vin1 at the switch control input terminal 15 and a high level is applied as the input Vin2 at the switch control input terminal 17 in the switch buffer 5, the ON/OFF states of the transistors Q1 and Q2 end the transistors Q5 and Q6 are reversed from those described above, i.e., the transistor Q5 is turned OFF and the transistor Q6 is turned ON, to allow the drive current Ip to flow to the resistor R5, resulting in the cessation of light output at the laser diode LD.

The drive current Ip which determines the output power of the laser diode LD is expressed as follows:

$$Ip=\{(V+)-(V-)-Vbe3-Vbe5-Vsft\}/R6 \quad \text{(expression 2)}$$

with (V+)−(V−) representing the source voltage, and Vbe3 and Vbe5 respectively representing the base-emitter voltages at the transistors Q3 and Q5 which are fixed values. Vsft represents the output voltage from the level shift circuit 3, which may be varied by adjusting the setting voltage Vset input to the input terminal 23 of the level shift circuit 3. Thus, by varying Vsft, variable control is implemented on the laser diode drive current Ip to enable control of the light output power of the laser diode LD.

The lower limit of the source voltage (V+)−(V−) is $$(V+)-(V-) \geq Vf+Vce5+Ip \cdot R6 \quad \text{(expression 3)}$$

with Vf representing the forward voltage of the laser diode LD and Vce5 representing the minimum value of the collector-emitter voltage at the transistor Q5. Vf is approximately 1.5 V, Vce5 is approximately 0.45V and Ip·R6 is approximately 0.35V. Thus, the lower limit of the source voltage is calculated by using (expression 3) as $$(V+)-(V-) \geq 2.3V$$

As a result, the laser diode drive circuit 1 is enabled to operate on the 2.5V single source, to realize a reduction in power consumption. In addition, since it becomes possible to utilize a common source with other communication LSIs in the future, advantages of simplification of the power supply in the system and cost reduction are achieved.

Figure 2:
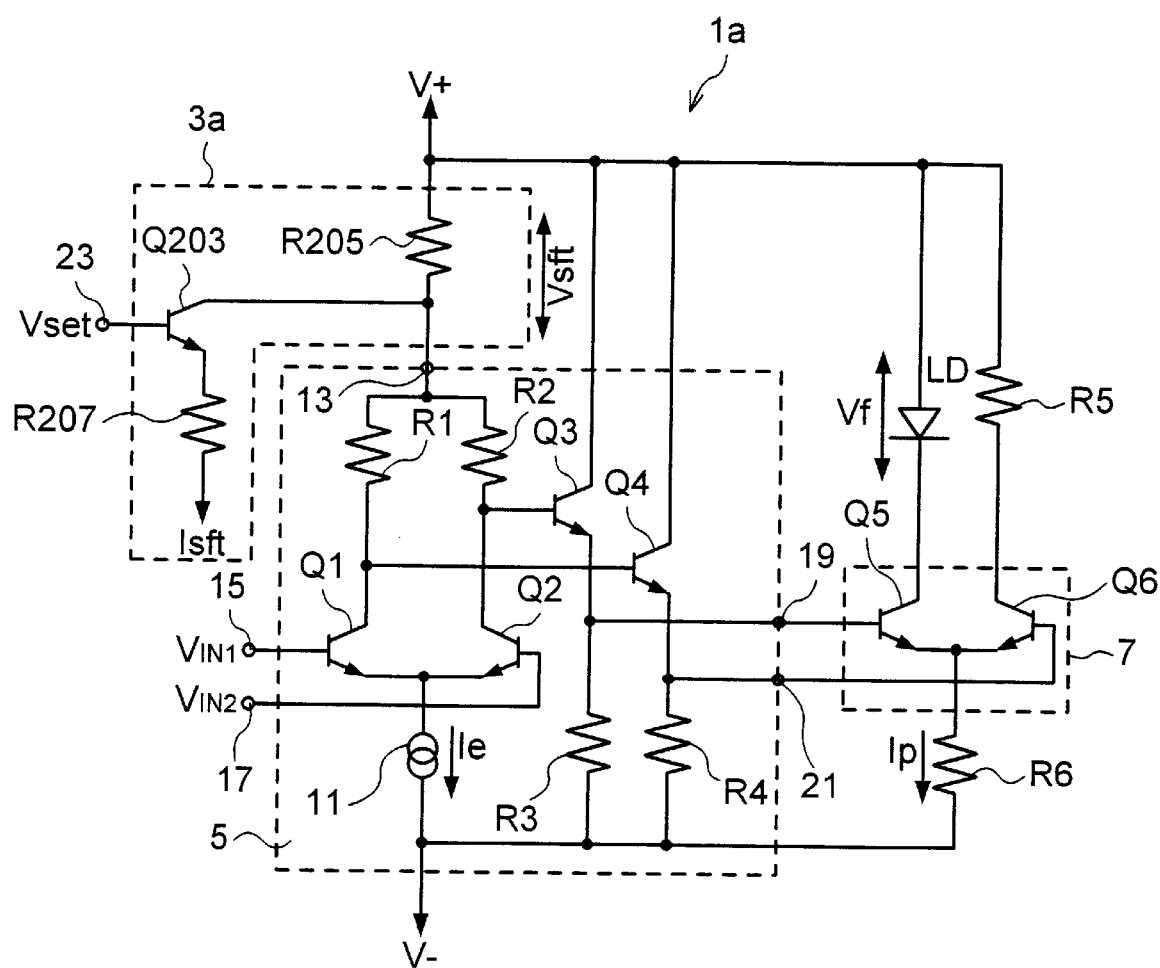
FIG. 2 is a circuit diagram of the laser diode drive circuit in a second embodiment.

Next, the second embodiment of the present invention is explained in reference to FIG. 2. FIG. 2 shows a laser diode drive circuit 1a in the second embodiment. Since a switch buffer 5, a current switch 7, drive sources (V+) and (V−), a laser diode LD and resistors R5 and R6 in the laser diode drive circuit 1a assume structures identical to those explained in reference to the first embodiment and engage in identical operations, their explanation is omitted. It is to be noted that they are assigned with the same reference numbers as well.

A level shift circuit, 3a employed in the laser diode drive circuit 1a, which is inserted between the drive source (V+) and the terminal 13 of the switch buffer 5, comprises a transistor Q203 and resistors R205 and R207. Vset is input to the base of the transistor Q203 via a terminal 23a. The resistor R207 is inserted between the emitter of the transistor Q203 and the ground, and Isft represents the current flowing through the resistor R207 (Isft is also the collector current at the transistor Q203). In addition, the collector of the transistor Q203 is connected to the terminal 13 of the switch buffer 5 and is also connected to the drive source (V+) via the resistor R205.

The operation achieved in the laser diode drive circuit 1a is similar to that explained in reference to the first embodiment, and when a high level is applied as the input Vin1 (positive phase) at the switch control input terminal 15 and a low level is applied as the input Vin2 (negative phase) at the switch control input terminal 17, electrical continuity is achieved for the laser diode LD to enable light emission, whereas when a low level is applied as the input Vin1 and a high level is applied as the input Vin2, light emission at the laser diode LD stops.

In this embodiment, the drive current Ip for the laser diode LD is expressed as in the first embodiment by using (expression 2). The drive current Ip for the laser diode LD is controlled by varying the output Vsft from the level shift circuit 3a, and in the second embodiment, Vsft is expressed as follows, as a voltage applied to the resistor R205.

$$Vsft=(Isft+Ie) \cdot R205 \quad \text{(expression 4)}$$

with Isft representing the collector current at the transistor Q203 and Ie representing the current flowing through the constant current source 11.

Namely, by varying the base potential Vset at the transistor 203, the drive current Ip of the diode LD is controlled.

It is to be noted that the lower limit of the source voltage (V+)−(V−), too, is expressed as in the first embodiment, by using (expression 3) and an advantage of a reduction in power consumption is achieved.

As explained above, in the second embodiment, too, advantages are achieved in that power consumption is reduced, in that the power supply in the system is simplified and in that cost reduction is realized as in the first embodiment. Furthermore, with the level shift circuit 3a assuming a simple structure constituted of two resistor elements and one transistor, a laser diode drive circuit which is ideal for integration is achieved.

Figure 3:
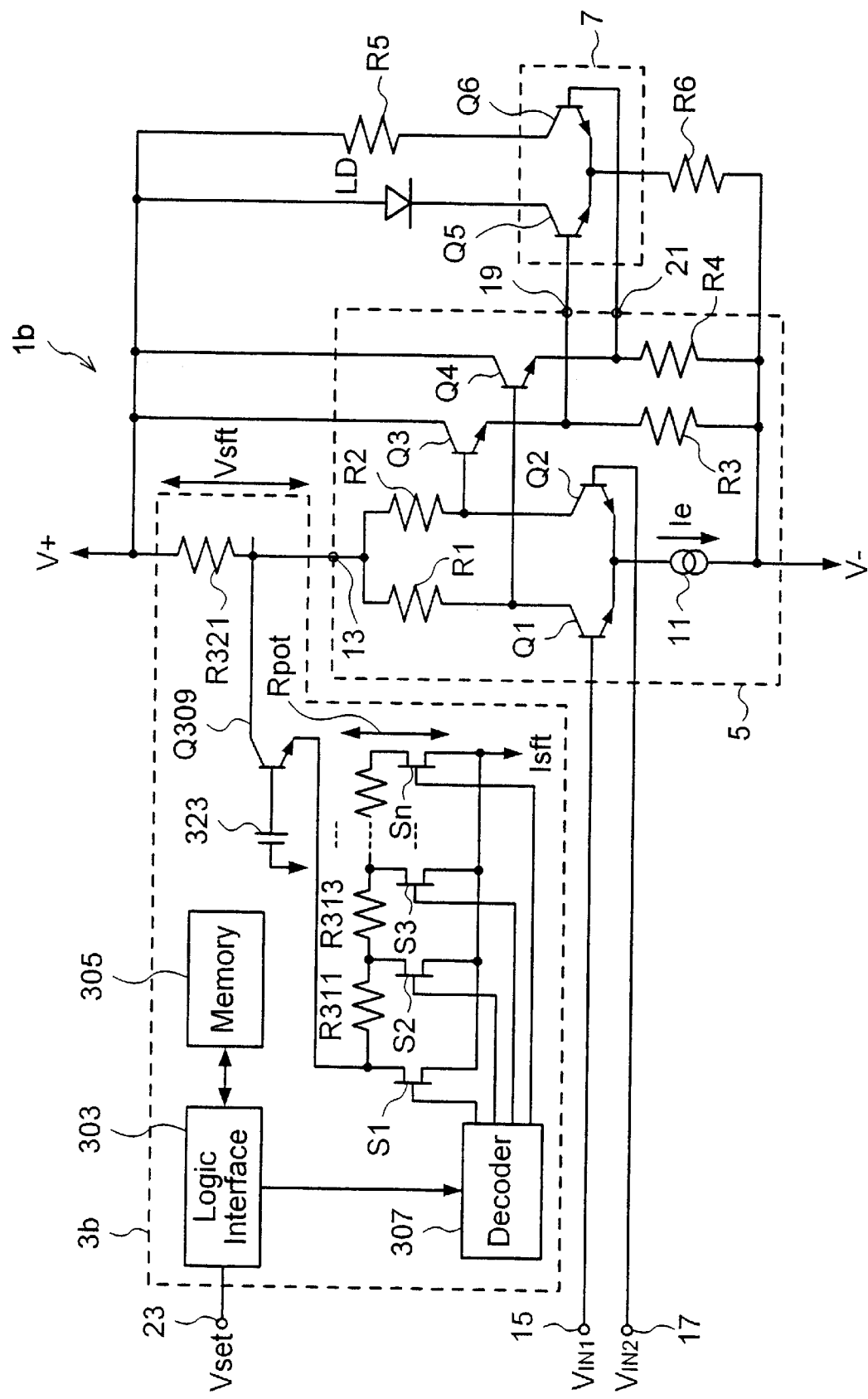
FIG. 3 is a circuit diagram of the laser diode drive circuit in a third embodiment.

FIG. 3 shows a laser diode drive circuit 1b in the third embodiment. Since a switch buffer 5, a current switch 7, drive sources (V+) and (V−), a laser diode LD and resistors R5 and R6 in the laser diode drive circuit 1b assume structures identical to those explained in reference to the first embodiment and engage in identical operations, their explanation is omitted. It is to be noted that they are assigned with the same reference numbers as well.

A level shift circuit 3b employed in the laser diode drive circuit 1b is inserted between the drive source (V+) and the terminal 13 of the switch buffer 5. The level shift circuit 3b comprises a transistor Q309, a resistor R321, a constant voltage source 323, a FET switch group (S1, S2, ...), a resistor group (R311, R313, ...), a logic interface 303, a memory 305 and a decoder 307.

The constant voltage source 323 is connected to the base of the transistor Q309. The collector of the transistor Q309 is connected to the terminal 13 of the switch buffer 5 and is also connected to the drive source (V+) via the resistor R321. The resistors (R311, R313, ...) in the resistor group are connected in series to the emitter of the transistor Q309 at one end. The other ends are each connected to the drain of one of the FETs in the FET switch group.

By selecting a FET that is to achieve electrical continuity among the FETs in the FET switch group (S1, S2, ...), the combined resistance Rpot of the resistor group (R311, R313, ...) is varied. Isft represents the current that flows through the combined resistance Rpot (Isft is also the collector current at the transistor Q309).

The gates of the individual FETs in the FET switch group (S1, S2, ...) are connected to the output of the decoder 307, the sources of the FETs are commonly connected and grounded, and the drains of the FETs are respectively connected to the connecting point of the individual resistors (R311, R313, ...) in the resistor group.

The logic interface 303 receives a signal Vset through a terminal 23b, engages in communication with the memory 305 and outputs a signal to the decoder 307.

The operation achieved in the laser diode drive circuit 1b is similar to that explained in reference to the first embodiment, and when a high level is applied as the input Vin1 (positive phase) at the switch control input terminal 15 and a low level is applied as the input Vin1 (negative phase) at the switch control input terminal 17, electrical continuity is achieved for the laser diode LD to enable light emission, whereas when a low level is applied as the input Vin1 and a high level is applied as the input Vin2, light emission at the laser diode LD stops.

In this embodiment, the drive current Ip for the laser diode LD is expressed as in the first embodiment by using (expression 2). The drive current Ip for the laser diode LD is controlled by varying the output Vsft from the level shift circuit 3b, and in the third embodiment, Vsft is expressed as follows, as a voltage applied to the resistor R321.

$$Vsft=(Isft+Ie) \cdot R321 \quad \text{(expression 5)}$$

with Isft representing the collector current at the transistor Q309 and Ie representing the current flowing through the constant current source 11.

Namely, in the third embodiment, Isft is varied by controlling the value of the combined resistance Rpot, which, in turn, varies the output Vsft from the level shift circuit 3b, thereby achieving control of the drive current Ip for the laser diode LD.

Next, the procedure which is followed to control the value of the combined resistance Rpot is explained. The signal Vset provided to the logic interface 303 is input to the terminal 23b of the level shift circuit 3b. The signal Vset is a digital signal provided to control the value of the combined resistance Rpot. The logic interface 303 engages in communication with the memory 305 which stores in memory the adjustment value and the setting value of the resistance Rpot to process the signal Vset, and transmits a signal which controls the value of the resistance Rpot to the decoder 307.

The decoder 307 which is connected to the gates of the individual FETs in the FET switch group (S1, S2, ...) processes the signal it has received and controls the value of the combined resistance Rpot by selecting a specific FET to achieve electrical continuity. For instance, if the decoder 307 selects S2 among the FET switches S1~Sn to become electrically continuous, Rpot=R311 is true, whereas if S3 alone is allowed to become electrically continuous, and Rpot=R311+R313 is true. By varying the value of the combined resistance Rpot by using the signal Vset in this manner, the drive current Ip for the diode LD is controlled.

It is to be noted that the lower limit of the source voltage (V+)−(V−) in the laser diode drive circuit 1b, too, is expressed using (expression 3) as in the first embodiment, and an advantage of a reduction in power consumption is achieved.

As explained above, in the third embodiment, too, advantages are achieved in that power consumption is reduced, in that the power supply in the system is simplified and in that a cost reduction is achieved as in the first embodiment. In addition, since the logic interface 303 is employed in the level shift circuit 3b which controls the drive current Ip, the light output power of the laser diode LD can be automatically adjusted with ease with a computer or the like.

Figure 4:
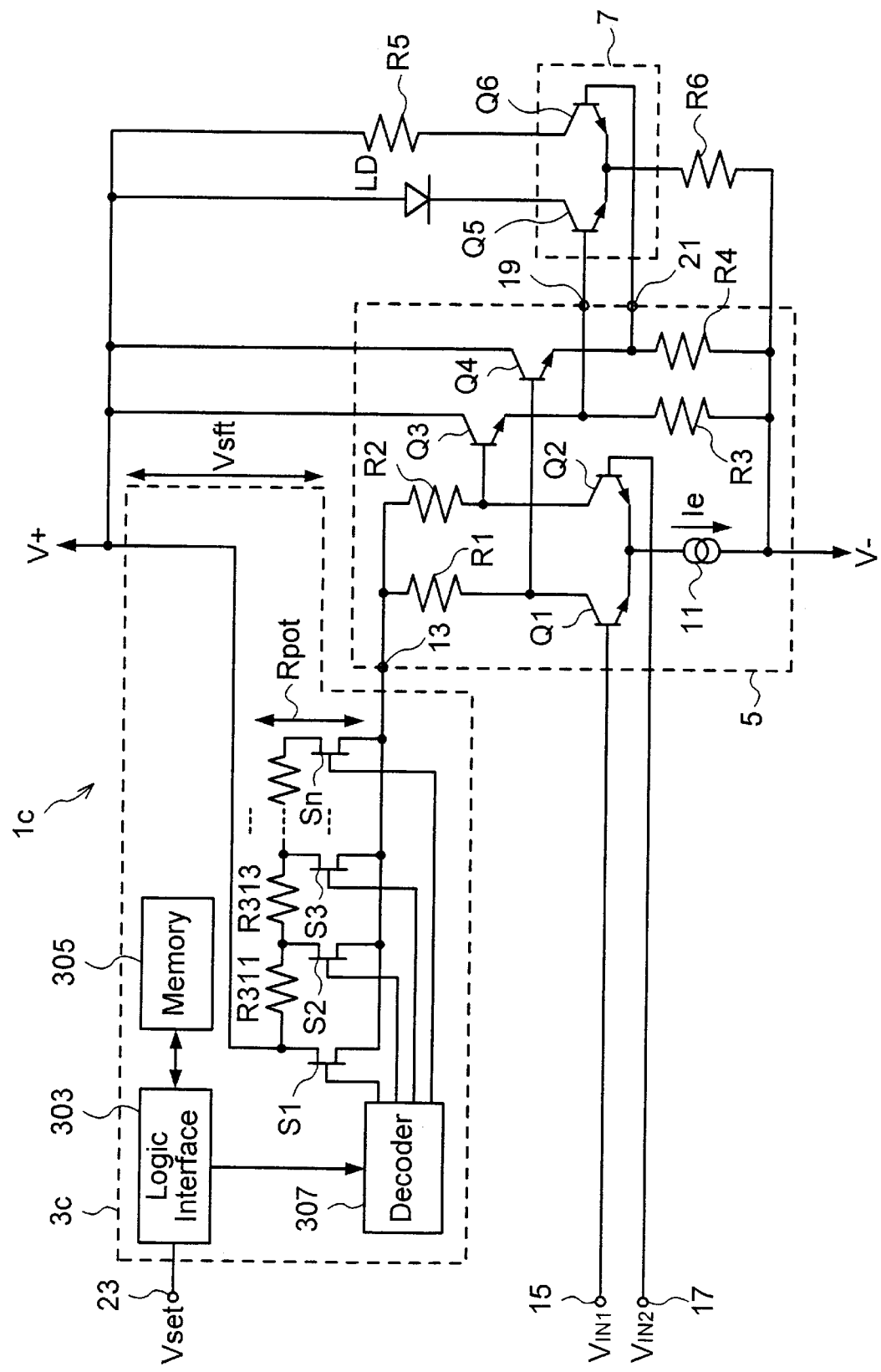
FIG. 4 is a circuit diagram of the laser diode drive circuit in a fourth embodiment.
Figure 5:
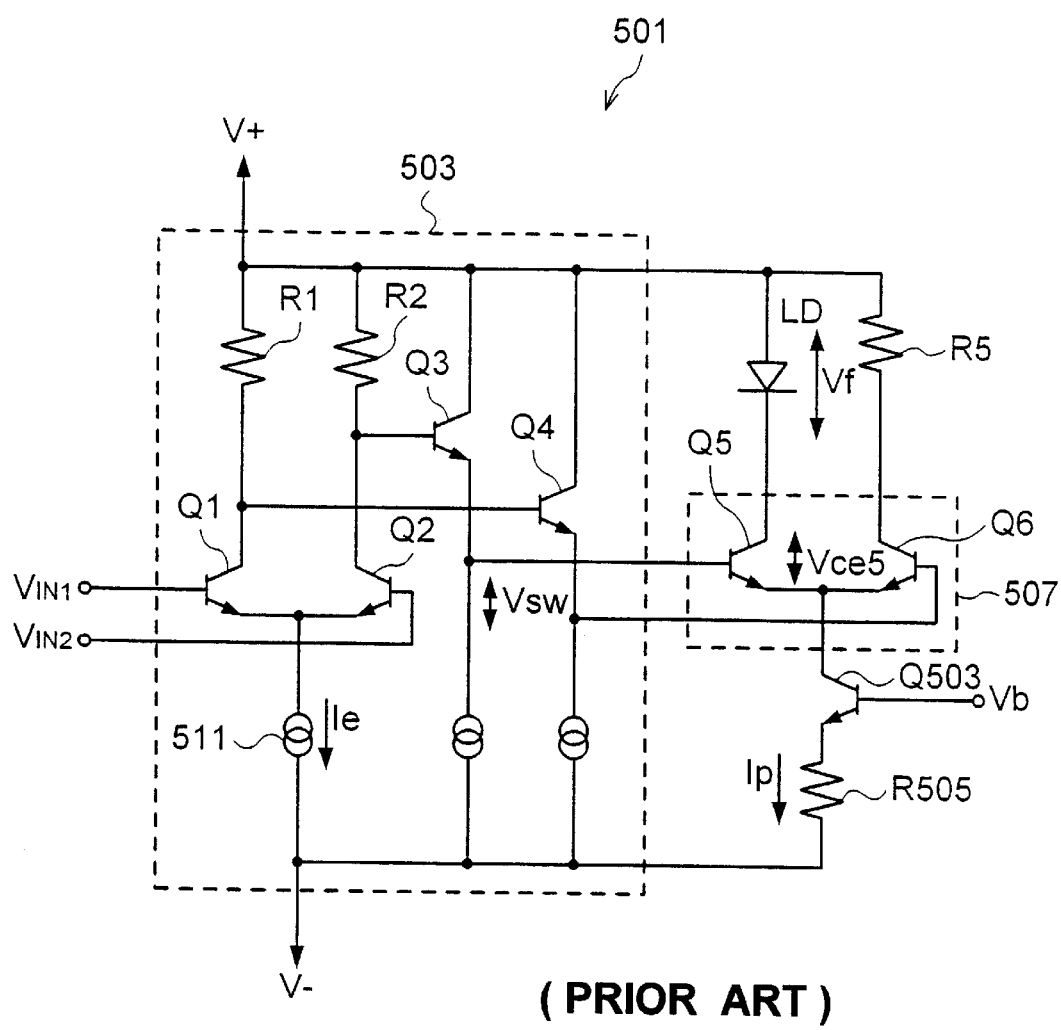
FIG. 5 is a circuit diagram of a laser diode drive circuit in the prior art.

FIG. 4 shows a laser diode drive circuit 1c in the fourth embodiment. Since a switch buffer 5, a current switch 7, drive sources (V+) and (V−), a laser diode LD and resistors R5 and R6 in the laser diode drive circuit 1c assume structures identical to those explained in reference to the first embodiment and engage in identical operations, their explanation is omitted. It is to be noted that they are assigned with the same reference numbers as well.

A level shift circuit 3c employed in the laser diode drive circuit 1c is inserted between the drive source (V+) and the terminal 13 of the switch buffer 5. The level shift circuit 3c comprises a FET switch group (S1, S2, ...), a resistor group (R403, R405, ...), a logic interface 303, a memory 305 and a decoder 307.

The resistors in the resistor group (R403, R405, ...) are connected in series to the drive source (V+) at one end. The other ends are each connected to the drain of one of the FETs in the FET switch group (S1, S2, ...). The gates of the individual FETs in the FET switch group (S1, S2, ...) are connected to the output of the decoder 307, the sources of the FETs are commonly connected and also connected to the terminal 13 of the switch buffer 5, and the drains of the FETs are respectively connected to the connecting points of the individual resistors (R403, R405, ...) in the resistor group.

Since the structures assumed by the decoder 307, the logic interface 303 and the memory 305 and the operations performed by them are identical to those explained in reference to the third embodiment, their explanation is omitted.

The operation achieved in the laser diode drive circuit 1c is similar to that explained in reference to the first embodiment, and when a high level is applied as the input Vin1 (positive phase) at the switch control input terminal 15 and a low level is applied as the input Vin2 (negative phase) at the switch control input terminal 17, electrical continuity is achieved for the laser diode LD to enable light emission, whereas when all low level is applied as the input Vin1 and a high level is applied as the input Vin2, light emission at the laser diode LD stops.

In this embodiment, the drive current Ip for the laser diode LD is expressed as in the first embodiment by using (expression 2). The drive current Ip for the laser diode LD is controlled by varying the output Vsft from the level shift circuit 3c, and in the fourth embodiment, Vsft is expressed as follows;

$$Vsft=Ie \cdot Rpot \quad \text{(expression 6)}$$

with Ie representing the current flowing through the constant current source 11.

Namely, in the fourth embodiment, the output Vsft from the level shift circuit 3c is varied by controlling the value of the combined resistance Rpot to control the drive current Ip for the laser diode LD.

The procedure followed to control the value of the combined resistance Rpot is identical to that implemented in the third embodiment. Namely, the decoder 307 processes the signal it has received and controls the value of the combined resistance Rpot by selecting a FET to become electrically continuous. In short, by varying the value of the combined resistance Rpot using the signal Vset, the drive current Ip of the diode laser LD is controlled.

It is to be noted that the lower limit of the source voltage (V+)–(V−) in the laser diode drive circuit 1c, too, is expressed using (expression 3) as in the first embodiment, and an advantage of a reduction in power consumption is achieved.

As explained above, the fourth embodiment, too, achieves advantages identical to those realized in the third embodiment, in that a reduction in power consumption is realized, in that the power supply in the system is simplified, in that a cost reduction is realized and in that light output power of the laser diode LD can be controlled by a computer. In addition, since the current that would otherwise be required by the level shift circuit (Isft in FIGS. 2 and 3) can be omitted in the fourth embodiment, a further reduction in power consumption is realized in the laser diode drive circuit.

It is to be noted that the level shift circuit 3 may assume a circuit structure other than those explained in reference to the second through fourth embodiments.

The laser diode drive circuit according to the present invention may be utilized in an optical transmission circuit that converts an electrical signal to an optical signal and transmits the optical signal in an optical communication system. However, it is not limited to application in optical communication systems, and it may be adopted in all types of systems having a circuit that converts an electrical signal to an optical signal by using a laser diode.

As explained in detail above, according to the present invention, a laser diode drive circuit can be driven at a lower voltage and a reduction in power consumption is realized.

The entire disclosure of Japanese Patent Application No. 2000-65719 filed on Mar. 6, 2000 including specification, claims, drawings and summary is incorporated herein by reference in its entirety.

What is claimed is:

1. A laser diode drive circuit comprising:
a level shift circuit connected to a drive source, that reduces a drive source voltage by a specific quantity;
a current switch that turns on/off a laser diode connected to said drive source; and
a switch buffer connected to said level shift circuit, that implements control on said current switch;
wherein said level shift circuit varies the quantity by which said drive source voltage is reduced in correspondence to a signal Vset input from the outside;
wherein said level shift circuit is provided with a first resistor located between said drive source voltage and said switch buffer and a plurality of resistors connected to said first resistor via a transistor, and a voltage generated at said first resistor is varied by varying a combined resistance of said plurality of resistors;
wherein:
said plurality of resistors are connected in series;
a plurality of switches are provided between said plurality of resistors and the ground; and
a decoder that selects one of said plurality of switches in conformance to said signal Vset input from the outside to vary said combined resistance of said plurality of resistors is provided.

2. A laser diode drive circuit comprising:
a level shift circuit connected to a drive source, that reduces a drive source voltage by a specific quantity;
a current switch that turns on/off a laser diode connected to said drive source; and
a switch buffer connected to said level shift circuit, that implements control on said current switch;
wherein said level shift circuit varies the quantity by which said drive source voltage is reduced in correspondence to a signal Vset input from the outside;
wherein said level shift circuit is provided with a combined resistance constituted of a plurality of resistors located between said drive source voltage and said switch buffer, and said level shift circuit varies the combined resistance value of said combined resistance;
wherein:
said plurality of resistors are connected in series;
a plurality of switches are provided between said plurality of resistors and said switch buffer; and
a decoder that selects one of said plurality of switches in conformance to said signal Vset input from the outside to vary said combined resistance of said plurality of resistors is provided.

* * * * *